US 6,570,251 B1

(12) United States Patent
Akram et al.

(10) Patent No.: US 6,570,251 B1
(45) Date of Patent: May 27, 2003

(54) UNDER BUMP METALIZATION PAD AND SOLDER BUMP CONNECTIONS

(75) Inventors: Salman Akram, Boise, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/388,436

(22) Filed: Sep. 2, 1999

(51) Int. Cl.[7] .................. H01L 23/48; H01L 23/495; H01R 31/26
(52) U.S. Cl. .................. 257/738; 257/737; 257/784; 257/490; 257/762; 257/766; 257/767; 257/772; 257/779; 257/780; 257/781; 257/786
(58) Field of Search .................. 257/738, 737, 257/778, 784, 786, 690, 693, 692, 762, 766, 767, 772, 773, 779, 780, 781

(56) References Cited

U.S. PATENT DOCUMENTS

| 4,360,142 | A | | 11/1982 | Carpenter et al. .......... 228/123 |
| 5,137,845 | A | | 8/1992 | Lochon et al. |
| 5,293,006 | A | | 3/1994 | Yung .................. 174/261 |
| 5,470,787 | A | | 11/1995 | Greer |
| 5,480,835 | A | | 1/1996 | Carney et al. .............. 205/125 |
| 5,672,542 | A | | 9/1997 | Schwiebert et al. |
| 5,736,456 | A | | 4/1998 | Akram .................. 438/614 |
| 5,821,494 | A | | 10/1998 | Albrecht et al. ....... 228/180.22 |
| 5,891,756 | A | * | 4/1999 | Erickson .................. 438/108 |
| 5,897,336 | A | * | 4/1999 | Brouillette et al. ......... 438/108 |
| 6,011,313 | A | * | 1/2000 | Shangguan et al. ......... 257/778 |
| 6,060,769 | A | * | 5/2000 | Wark .................. 257/666 |
| 6,083,820 | A | * | 7/2000 | Farnworth .................. 438/614 |
| 6,084,312 | A | * | 7/2000 | Lee .................. 257/786 |
| 6,114,239 | A | * | 9/2000 | Lake et al. .................. 438/653 |
| 6,144,103 | A | * | 11/2000 | Miller et al. .................. 257/781 |
| 6,204,089 | B1 | * | 3/2001 | Wang .................. 438/108 |
| 6,232,243 | B1 | * | 5/2001 | Farnworth et al. .......... 438/763 |
| 6,232,666 | B1 | * | 5/2001 | Corisis et al. .............. 257/738 |
| 6,274,391 | B1 | * | 8/2001 | Wachtler et al. .............. 438/6 |
| 6,329,222 | B1 | * | 12/2001 | Corisis et al. .............. 438/111 |
| 6,337,445 | B1 | * | 1/2002 | Abbott et al. .............. 174/260 |

* cited by examiner

*Primary Examiner*—Alexander O. Williams
(74) *Attorney, Agent, or Firm*—Dickstein Shapiro Morin & Oshinsky LLP (57) ABSTRACT

The present invention relates to an improved method of forming and structure for under bump metallurgy ("UBM") pads for a flip chip which reduces the number of metal layers and requires the use of only a single passivation layer to form, thus eliminating a masking step required in typical prior art processes. The method also includes repatterning bond pad locations.

7 Claims, 13 Drawing Sheets

UNDER BUMP METALIZATION PAD AND SOLDER BUMP CONNECTIONS

BACKGROUND OF THE INVENTION

1. Field of the Invention

The present invention relates generally to integrated circuits, and more particularly to under bump metallization pads and solder bumps on the die for flip chip type attachment to a printed circuit board or the like.

2. Description of the Related Art

Solder ball or bump technology is commonly used for electrical and mechanical interconnection of an integrated circuit to a substrate. High performance microelectronic devices may comprise a number of flip chips, i.e., a chip or die that has a pattern or array of terminations spaced around the active surface of the die for face-down mounting of the die to a substrate, having a Ball Grid Array (BGA) or a Slightly Larger than Integrated Circuit Carrier (SLICC). Each flip chip may be attached to a ceramic or silicon substrate or printed circuit board (PCB), such as an FR-4 board, for electrical interconnection to other microelectronic devices. For example, a very large scale integration (VLSI) chip may be electrically connected to a substrate, printed circuit board, or other next higher level packaging carrier member using solder balls or solder bumps. This connection technology may be referred to generically as "flip chip" or "Controlled Collapse Chip Connection (C4)" attachment.

Flip chip attachment requires the formation of contact terminals at flip chip contact sites on the semiconductor die, each site having a metal pad with a lead/tin solder ball formed thereon. Flip chip attachment also requires the formation of solder joinable sites ("pads") on the metal conductors of the PCB or other substrate or carrier which are a mirror-image of the solder ball arrangement on the flip chip. The pads of the substrate are usually surrounded by non-solderable barriers so that when the solder balls of the chip contact sites aligned with the substrate pads and are "reflowed", the surface tension of the liquified solder element supports the semiconductor chip above the substrate. After cooling, the chip is essentially soldered face-down by very small, closely spaced, solidified solder interconnections. An underfill encapsulant is generally disposed between the semiconductor die and the substrate for environmental protection, and to further enhance the mechanical attachment of the die to the substrate.

Figure 1A:
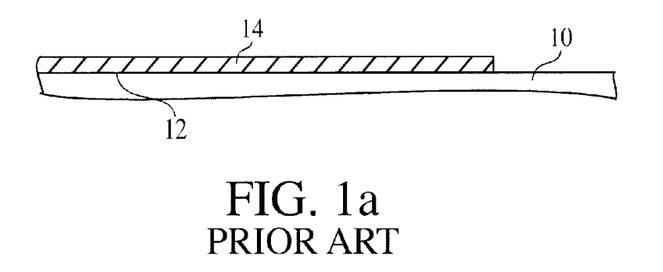
FIGS. 1a–1h illustrate side cross sectional views of a prior art process of forming flip chip solder bump connections.
Figure 1B:
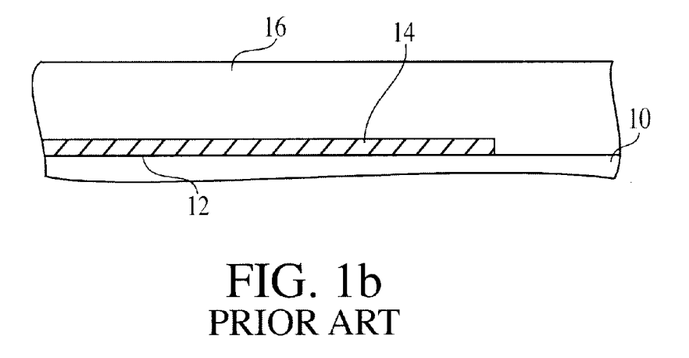
Figure 1C:
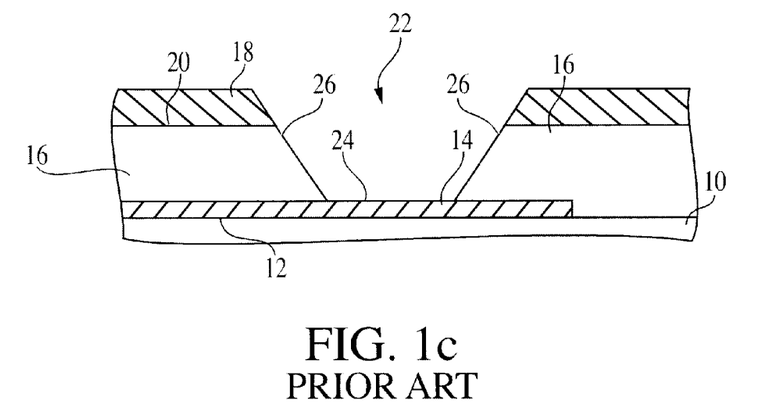
Figure 1D:
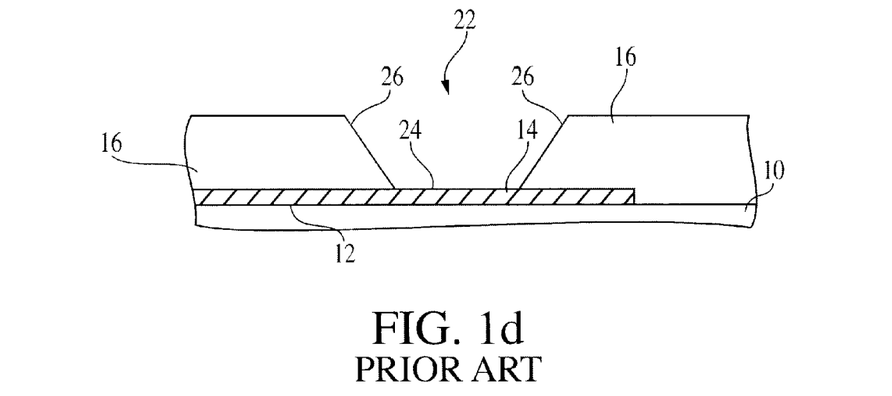

FIGS. 1a–1h show a known method of forming a conductive ball arrangement on a flip chip. First, a plurality of semiconductor elements such as dice including integrated circuitry (not shown) are fabricated on a face surface 12 of a semiconductor wafer 10. A plurality of conductive traces 14 are formed on the semiconductor wafer surface 12 in a position to contact circuitry of the respective semiconductor elements (not shown), as shown in FIG. 1a. A passivation film 16, such as at least one layer of $SiO_2$ film, $Si_3N_4$ film, or the like is formed over the semiconductor wafer surface 12 as well as the conductive traces 14 as shown in FIG. 1b. A first layer of etchant-resistive photoresist film 18 is then applied to a face surface 20 of the passivation film 16. The first photoresist film 18 is then masked, exposed, and stripped to form the desired openings (one illustrated) in the first photoresist film 18. The passivation film 16 is then etched through the opening in photoresist film 18 to form a via 22 with either sloped edges or walls 26 or straight (vertical) walls if desired, and which exposes a face surface 24 of the conductive trace 14, as shown in FIG. 1c. Photoresist 18 is then stripped, as shown in FIG. 1d.

Figure 1E:
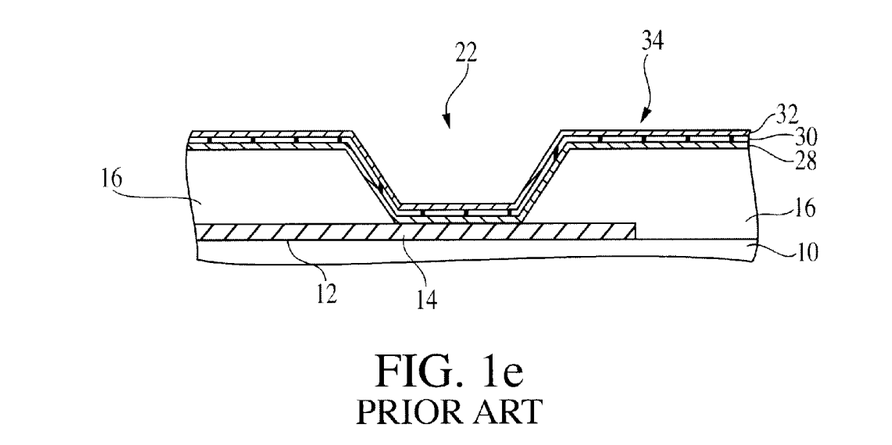

FIG. 1e shows metal layers 28, 30, and 32 applied over the passivation film face surface 20 as well as the via 22 to form a multi-layer under bump metallurgy (UBM) 34 by chemical vapor deposition (CVD), plasma-enhanced chemical vapor deposition (PECVD), or physical vapor deposition (PVD) (sputtering or evaporation). The metal layers usually comprise chromium for the first or base adhesion layer 28, chromium-copper alloy for a second, intermediate layer 30, and copper for the third, outer soldering layer 32. Additionally, a fourth metal layer (not shown) of flashed gold may be placed atop the copper third layer 32 to prevent oxidation of the copper. Nickel, palladium and platinum have also been employed as the outer or soldering layer 32. Furthermore, titanium or titanium/tungsten alloys have been used as alternatives to chromium for the adhesion layer. Two-layer UBMs with a gold flash coating are also known, as are single-layer UBMs.

Figure 1F:
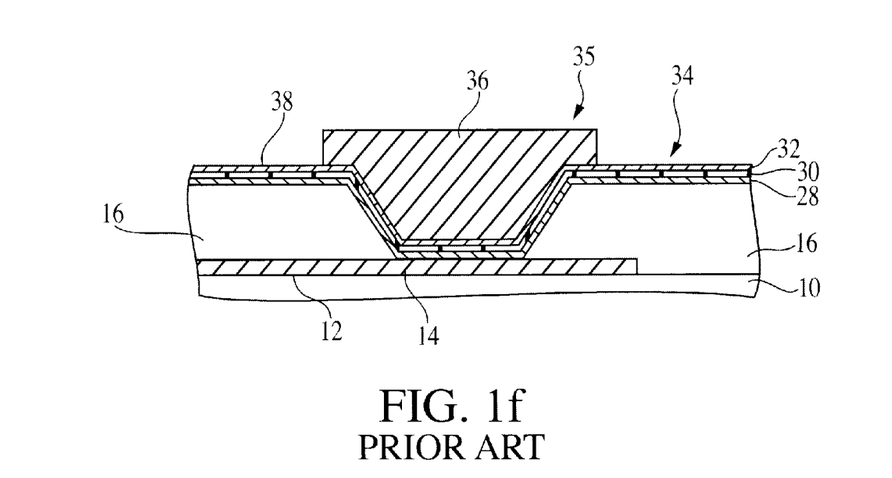
Figure 1G:
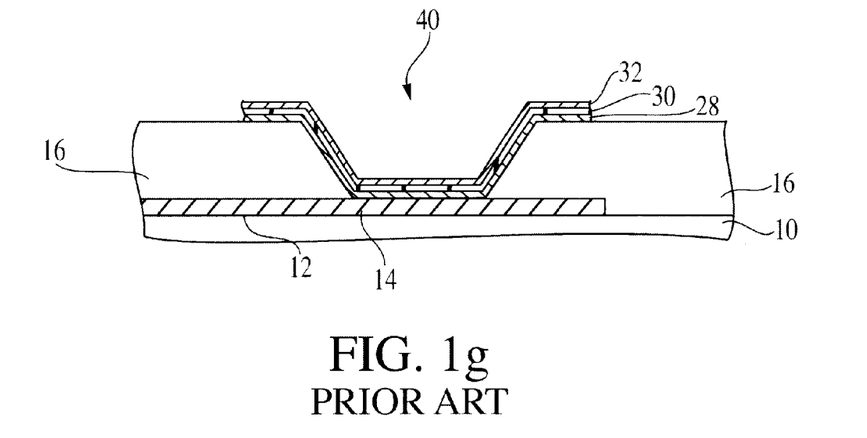
Figure 1H:
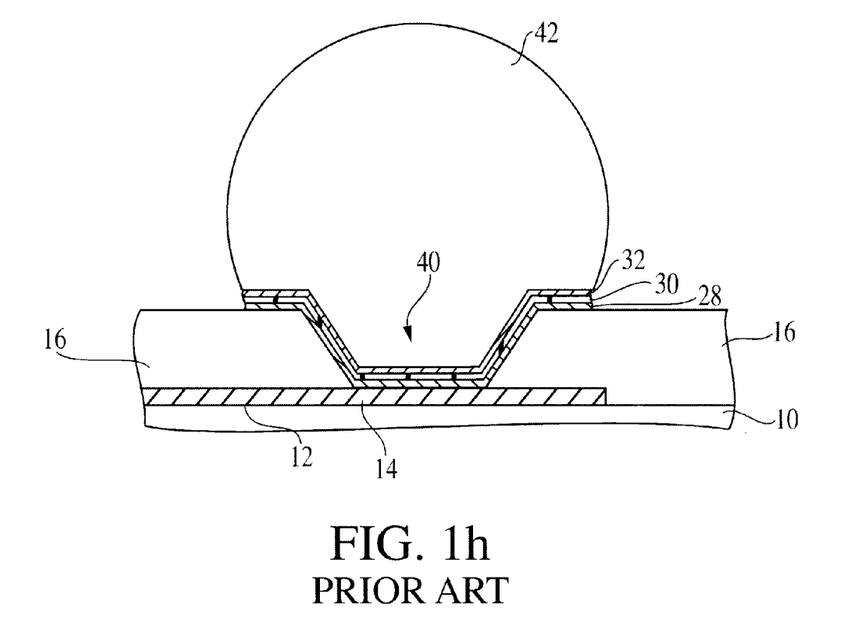

A second layer of etchant-resistive photoresist film 35 is applied to a face surface 38 of the third metal layer 32. The second photoresist film 35 is then masked, exposed, and stripped to form at least one second etchant-resistive block 36 over the via 22, as shown in FIG. 1f. The metal layers 28, 30, and 32 surrounding the via 22 are then etched and the etchant-resistive block 36 is stripped to form a discrete UBM pad 40, as shown in FIG. 1g. A solder bump 42 is then formed on the UBM pad 40, as shown in FIG. 1h, by any known industry technique, such as stenciling, screen printing, electroplating, electroless plating, evaporation or the like.

The UBM pads 40 can also be made by selectively depositing the metal layers by evaporation through a mask (or photoengraving) onto the passivation film face surface 20 as well as the via 22 such that the metal layers 28, 30, and 32 correspond to the exposed portions of the conductive traces 14.

Solder balls are generally formed of lead and tin. High concentrations of lead are sometimes used to make the bump more compatible with subsequent processing steps. Tin is added to strengthen bonding (to such metal as copper) and serves as an antioxidant. High temperature (melting point approximately 315° C.) solder alloy has been used to join chips to thick ceramic substrates and multi-layer cofired ceramic interface modules. Joining chips to organic carriers such as polymide-glass, polyimide-aramid and the like as well as the printed wiring boards requires lower temperatures which may be obtained by using 63 In/37 Pb solder (melting point approximately 183° C.) and various Pb/In alloys such as 50 PB/50 In (melting point approximately 220° C.). Lower melting point alloys (down to 60° C.) have been used to bump very temperature-sensitive chips such as GaAs and superconducting Josephson junctions.

Numerous techniques have been devised to improve the formation of UBM and solder bumps for flip chips. For example, U.S. Pat. No. 4,360,142 issued Nov. 23, 1982 to Carpenter et al. relates to forming multiple layer UBM pads between a semiconductor device and a supporting substrate particularly suited to high stress use conditions that generate thermal gradients in the interconnection.

U.S. Pat. No. 5,137845 issued Aug. 11, 1992 to Lochon et al. pertains to a method of forming solder bumps and UBM pads of a desired size on semiconductor chips based on an involved photolithographic technique such that the dimensions of the solder bumps can be reduced in order to increase the number of bumps on a chip.

U.S. Pat. No. 5,470,787 issued Nov. 28, 1995 to Greer relates to a substantially cylindrical layered solder bump wherein the bump comprises a lower tin layer adjacent to the UBM pad, a thick lead layer, and an upper tin layer to provide an optimized, localized eutectic formation at the top of the bump during solder reflux.

U.S. Pat. Nos. 5,293,006 and 5,480,835 also disclose materials and techniques for forming UBM pads and solder bumps.

There are problems, however, with the conventional techniques for forming UBM pads and solder bumps. All of the above patents and prior art techniques for forming UBM pads and solder bumps are relatively complex and require a substantial number of discrete steps to form the flip chip conductive bumps.

Thus, there exists a need for more efficient conductive bump structures on a flip chip to eliminate some of the steps required by present industry standard techniques while using commercially-available, widely-practiced semiconductor device fabrication materials and techniques.

SUMMARY OF THE INVENTION

In accordance with the present invention, an improved method of forming and improved structure for under bump metallurgy ("UBM") pads and solder bumps for a flip chip are described and illustrated. The present invention provides a simpler, improved UBM formation process which reduces the number of metal layers and requires the use of only a single passivation layer to form, thus reducing the number of masking steps required in typical prior art processes.

According to a first embodiment of the present invention, a Ti-Ni layer is deposited and patterned on the pad of the substrate to form the UBM pad. An additional flash layer of metal, such as for example gold, silver, or palladium, is deposited on the Ti-Ni layer to prevent oxidation. A solder bump is then formed on the UBM pad, such as for example by a standard wire bonder. The solder bump is then reflowed, during which the additional layer of metal is consumed by the solder ball, to form the conductive bump on the substrate for flip chip attachment to a printed circuit board or the like.

In accordance with a second embodiment of the present invention, a solder bump is deposited directly on top of the flash layer on a copper bond pad on a substrate, thus eliminating the need for additional layers.

These and other advantages and features of the invention will become apparent from the following detailed description of the invention which is provided in connection with the accompanying drawings.

DETAILED DESCRIPTION OF THE PREFERRED EMBODIMENTS

The present invention will be described as set forth in the preferred embodiments illustrated in FIGS. 2–6. Other embodiments may be utilized and structural or logical changes may be made without departing from the spirit or scope of the present invention. Like items are referred to by like reference numerals.

Figure 2A:
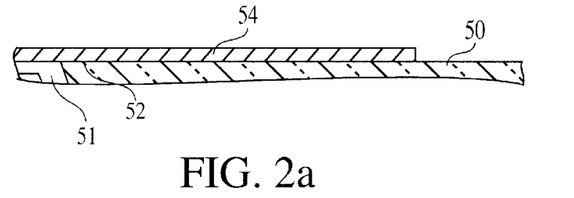
FIGS. 2a–2d illustrate side cross sectional views of a method of forming the metal coated, via-containing wafer surface according to the present invention.
Figure 2B:
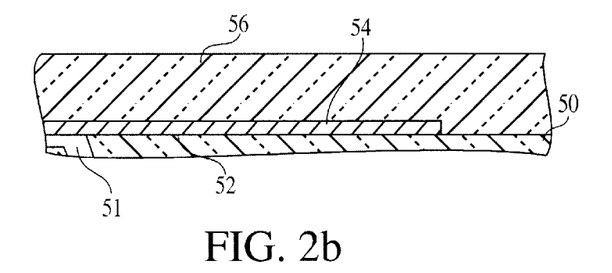
Figure 2C:
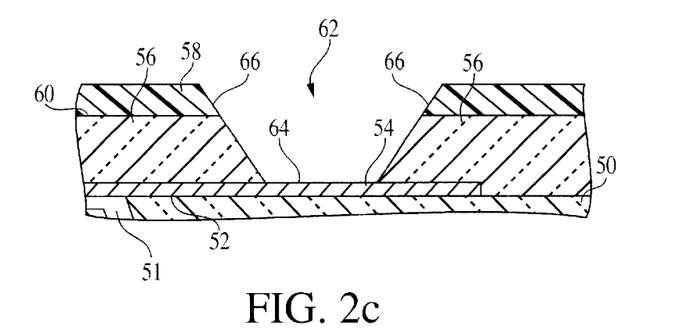

FIGS. 2a–2d show the initial steps of a method of forming a metal layered wafer as employed in the present invention. Only the initial steps shown in FIGS. 2a–2d are substantially similar to known prior art techniques. A plurality of semiconductor elements (dice) including integrated circuitry 51 formed on a face surface 52 of a semiconductor wafer 50. A plurality of conductive traces or bond pads 54, preferably aluminum or copper traces or pads, are formed on the semiconductor wafer face surface 52 positioned to contact circuitry of respective semiconductor elements (not shown), as shown in FIG.,2a. A passivation film 56 such as one or more layers of $SiO_2$ film, $Si_3N_4$ film, or the like (sometimes doped with boron, phosphorous or both to enhance protective properties) or the use of polymers such as polyimide, is formed on the semiconductor wafer face surface 52 as well as over the conductive traces or pads 54, as shown in FIG. 2b. A single layer of $Si_3N_4$ is preferred, alone or with a superimposed polyimide layer. A first layer of etch resist film 58 such as a photoresist is applied to a face surface 60 of the passivation film 56. The first etch resist film 58 is then masked, exposed, and stripped to form the desired openings or apertures in the first etch resist film 58. The passivation film 56 is then etched through the resist apertures to form sloped walls or vias 62 (one illustrated) with sloped edges or walls 66 which exposes a face surface 64 of the underlying conductive trace or pad 54, as shown in FIG. 2c. It is to be understood that the walls 66 may be straight (vertical) if desired. The etch resists film 58 is subsequently stripped, leaving the structure shown in FIG. 2d. Note, if a photoimageable polyimide film is used, which can be patterned directly, etch resist film 58 is not required.

Figure 2D:
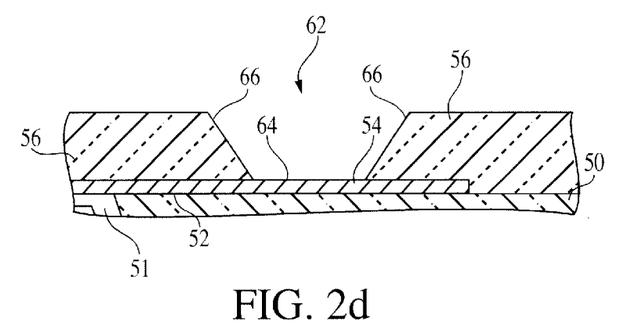
Figure 3A:
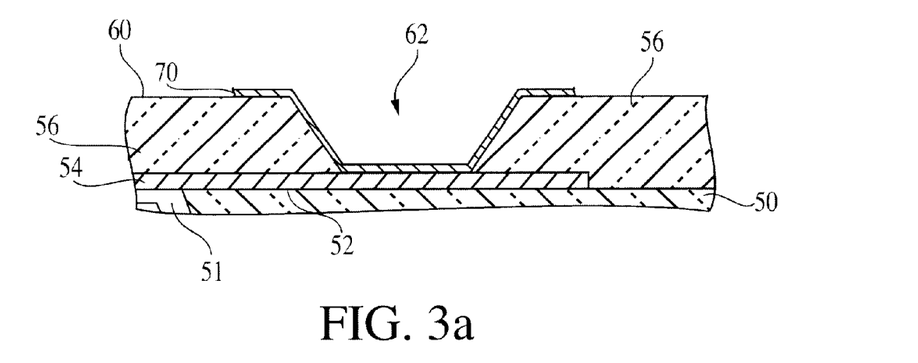
FIGS. 3a–3e illustrate a preferred method of forming UBM pads and flip chip solder bump connections according to a first embodiment of the present invention.
Figure 3B:
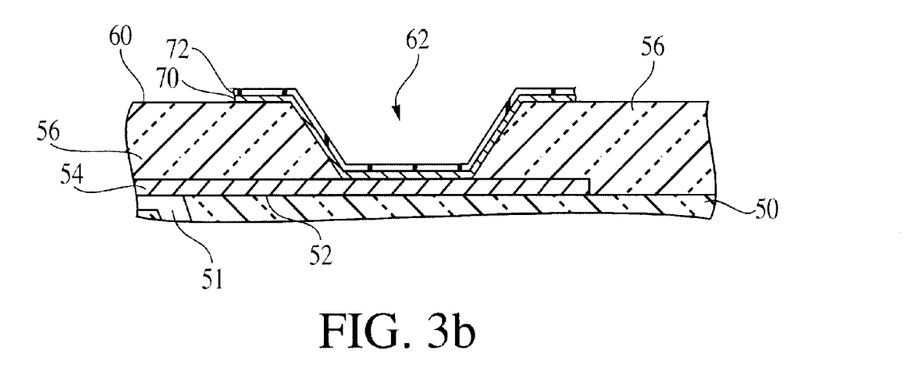

FIG. 3a–3e illustrate a preferred method of forming UBM structures and flip chip solder bump connections in accordance with a first embodiment of the present invention. FIG. 3a shows a first metal layer 70 applied over the passivation film face surface 60 as well as the via 62 of the structure shown in FIG. 2d. Metal layer 70 is preferably formed of Titanium (Ti), and is preferably between approximately 500 to 3000 Å thick. A second metal layer 72 is applied over the first metal layer 70 as illustrated in FIG. 3b. Second metal layer 72 is preferably formed of Nickel (Ni), and is preferably between 500 and 5000 Å thick. Although FIG. 3b illustrates first layer 70 and second layer 72 preferably as being discrete layers, the invention is not so limited and only a single layer comprised of a mixture of titanium and nickel may be used. The layers 70, 72 may be applied by any method as is known in the art, such as for example by chemical vapor deposition (CVD), physical vapor deposition (PVD) sputtering, or the like. The metal layers may be patterned by standard photolithography techniques.

Figure 3C:
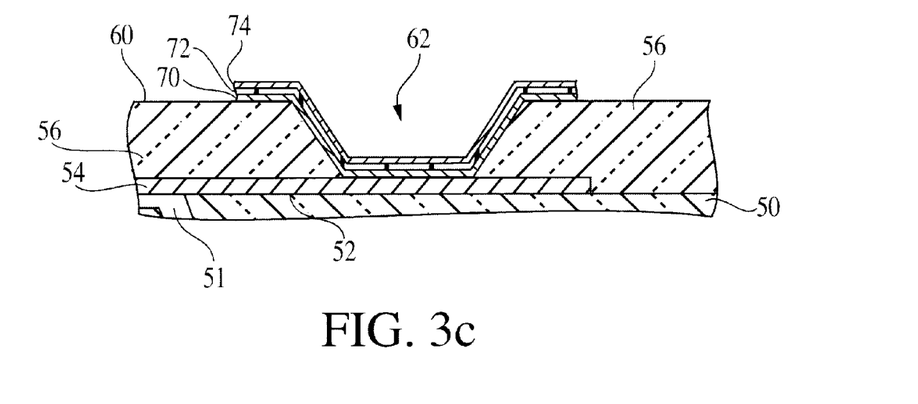
Figure 3D:
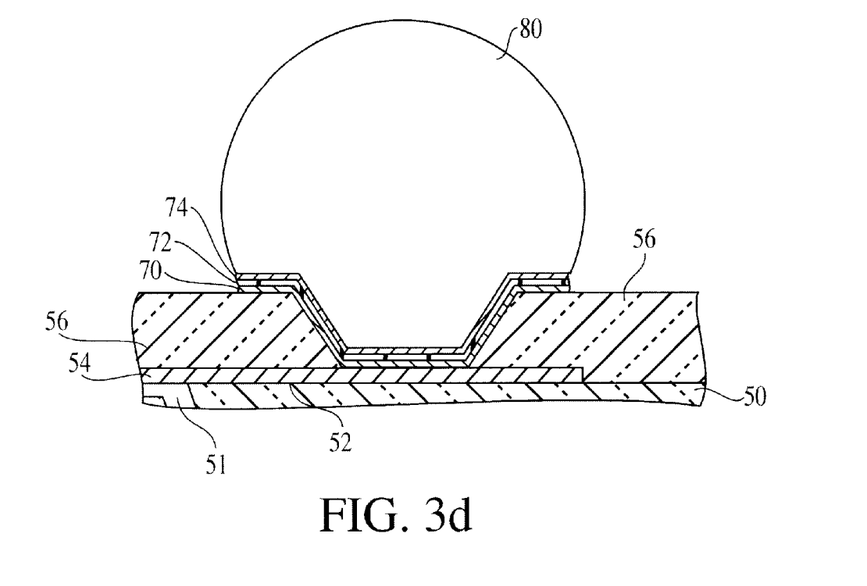
Figure 3E:
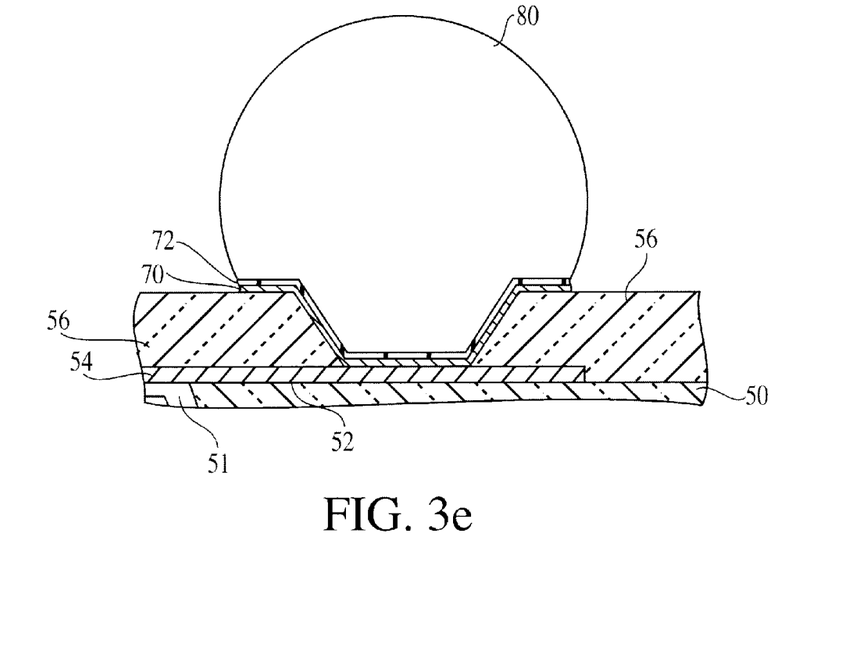

A third metal layer 74, preferably formed of gold (Au), silver (Ag) or palladium (Pd), may be deposited or flashed atop the nickel second metal layer 72 to prevent oxidation of the nickel as shown in FIG. 3c. Third metal layer 74 is preferably between approximately 50 and 1000 Å thick. A solder bump 80 is deposited on the UBM pad formed by the metal layers 70, 72, 74 by any known industry technique, such as stenciling, screen printing, electroplating, electroless plating, evaporation, laser ball shooters, or the like as shown in FIG. 3*d*. Alternatively, solder bump 80 may also be formed utilizing a standard wire bonder as will be described below. When solder bump 80 is reflowed, the flash layer 74 will be consumed by solder ball 80, leaving only layers 70, 72 as shown in FIG. 3*e*. Solder bump 80 is typically formed of lead and tin, preferably a composition consisting of 63% tin and 37% lead. A low alpha emission solder, such as for example with $\alpha<0.001$ hits/cm$^2$/hr, is preferable. Alternatively, lead free solders such as Sn/In and SnSb or other alloys of these containing more than 2 elemental metals can also be employed.

Figure 4A:
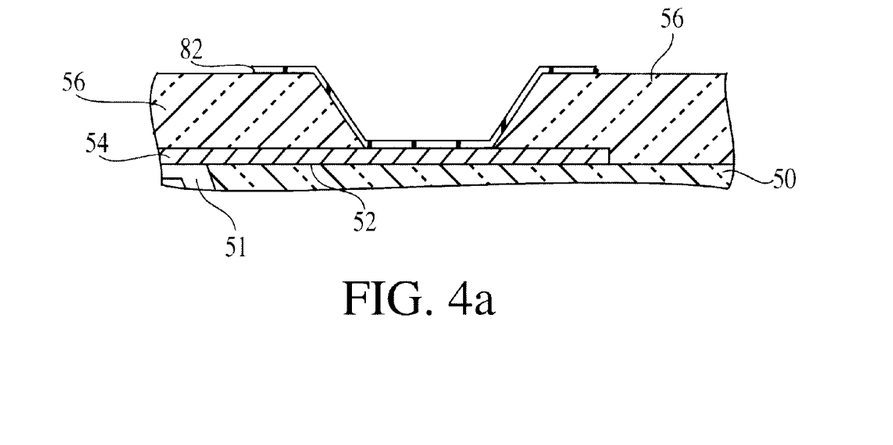
FIGS. 4a–4c illustrate a preferred method of forming UBM pads and flip chip solder bump connections according to a second embodiment of the present invention.
Figure 4B:
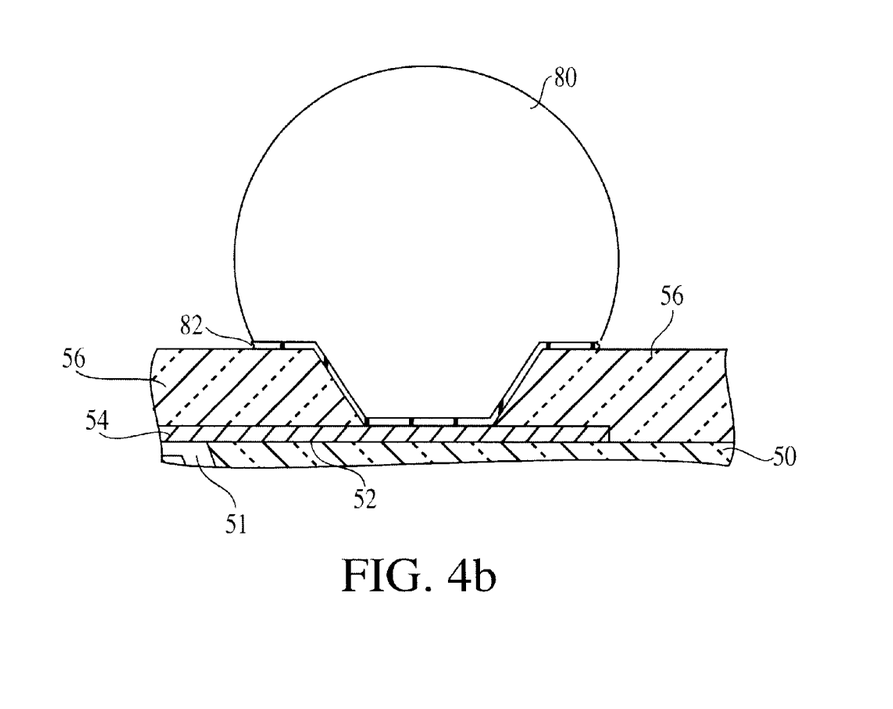
Figure 4C:
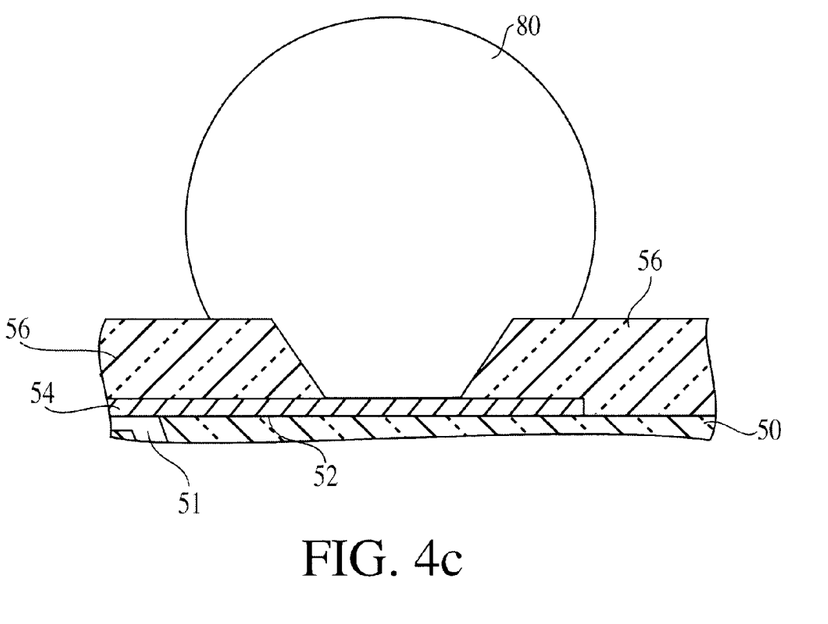

FIGS. 4*a*–4*c* illustrate a preferred method of forming a UBM pad and flip chip solder bump connections according to a second embodiment of the present invention. In this embodiment it is preferable that the conductive traces or bond pads 54 on the semiconductor wafer face surface 52 are formed of copper. As shown in FIG. 4*a*, metal layer 82, preferably formed of gold (Au), silver (Ag) or palladium (Pd), is deposited or flashed over the passivation film face surface 60 as well as the via 62 of the structure shown in FIG. 2*d*. Metal layer 82 is preferably between 50 and 1000 Å thick.

A solder bump 80 is deposited on the layer 82 by any known industry technique, such as stenciling, screen printing, electroplating, electroless plating, evaporation, laser ball shooters, or the like as shown in FIG. 4*b*. Alternatively, solder bump 80 may also be formed utilizing a standard wire bonder as will be described below. When solder bump 80 is reflowed, the flash layer 82 will be consumed by solder ball 80, leaving solder ball 80 directly on top of bond pad 54 as shown in FIG. 4*c*. Solder bump 80 is typically formed of lead and tin, preferably a composition consisting of 63% tin and 37% lead. A low alpha emission solder, such as for example with $\alpha<0.001$ hits/cm$^2$/hr, is preferable. Alternatively, lead free solders such as Sn/In and SnSb or other alloys of these containing more than 2 elemental metals can also be employed.

Figure 5A:
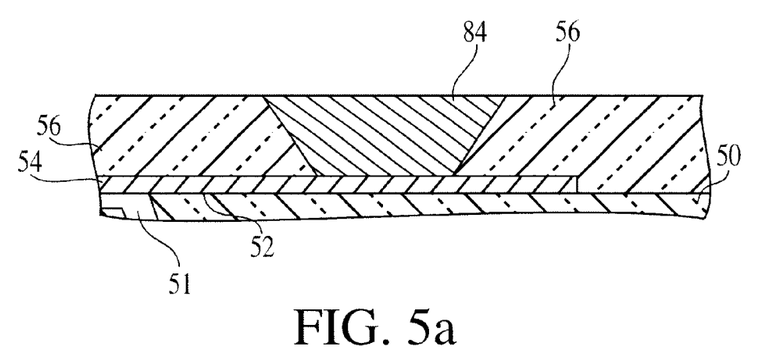
FIGS. 5a–5c illustrate a preferred method of producing solder bump connections with solder wire according to the present invention.
Figure 5B:
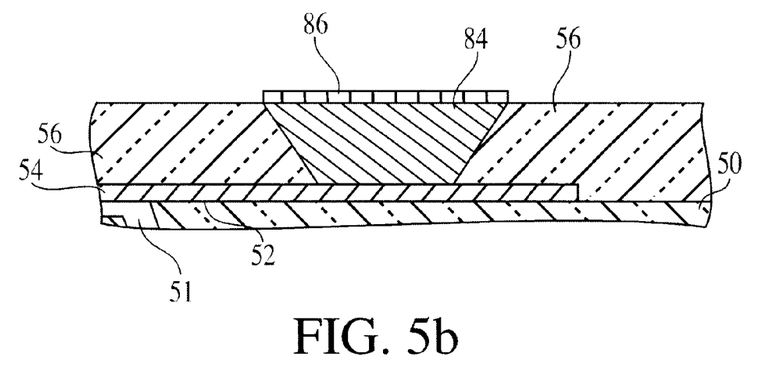
Figure 5C:
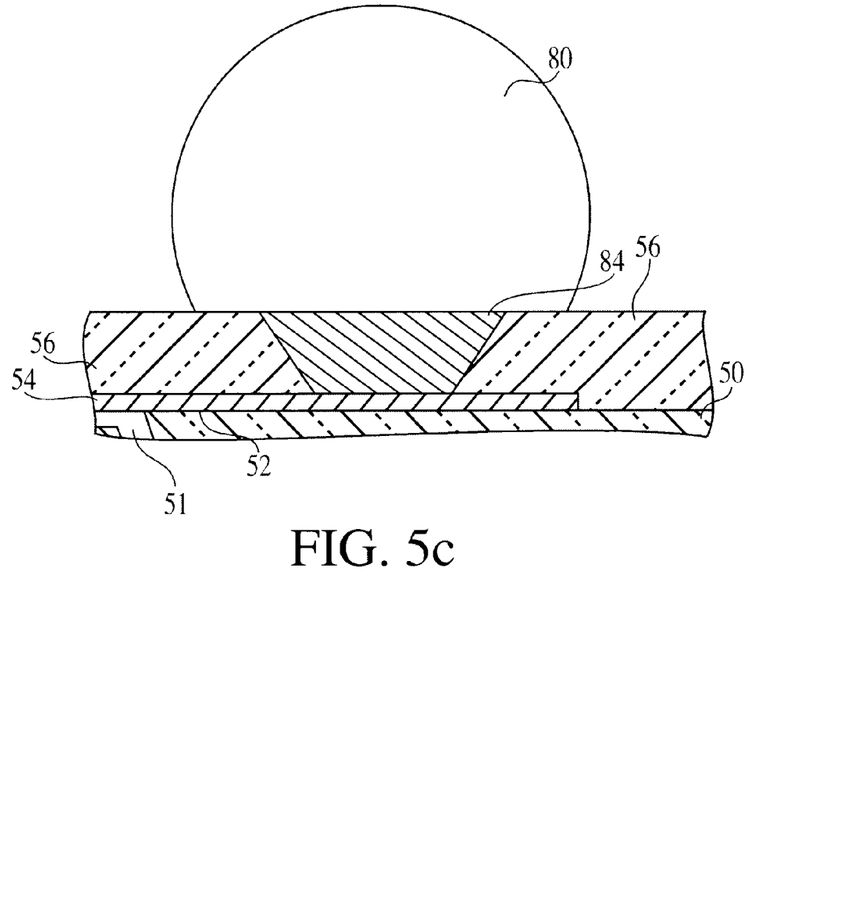

FIGS. 5*a*–5*c* illustrate a preferred method of forming a UBM structure and flip chip solder bump connections according to a third embodiment of the present invention. In this embodiment, a via 62 of the structure shown in FIG. 2*d* is plated with nickel (Ni) 84 as illustrated in 5*a*. It should be noted that although FIG. 5*a* shows the nickel plating as being at the same level as the top surface of passivation film 56, the upper surface of the nickel 84 may also be at a level which is higher or lower than the top surface of the passivation layer 56. Then, as shown in FIG. 5*b*, metal layer 86, preferably formed of gold (Au), is deposited or flashed over the plated nickel (Ni) 84. Although FIG. 5*b* shows the upper surface of metal layer 86 as being above the top surface of the passivation film 56, it could also be at the same level or below the level of the top surface of the passivation film 56.

A solder bump 80 is deposited on the layer 86 by any known industry technique, such as stenciling, screen printing, electroplating, electroless plating, evaporation, ball shooters, or the like. Alternatively, solder bump 80 may also be formed utilizing a standard wire bonder as will be described below. When solder bump 80 is reflowed, the flash layer 86 will be consumed by solder ball 80, leaving solder ball 80 directly on top of plated nickel 84 as shown in FIG. 5*c*. Solder bump 80 is typically formed of lead and tin, preferably a composition consisting of 63% tin and 37% lead. A low alpha emission solder, such as for example with $\alpha<0.001$ hits/cm$^2$/hr, is preferable. Alternatively, lead free solders such as Sn/In and SnSb or other alloys of these containing more than 2 elemental metals can also be employed.

Thus, in accordance with the present invention, the number of metal layers required for the UBM is reduced, as well as the number of masking steps required to deposit the UBM and solder bump on the solder pad of the substrate.

Figure 6A:
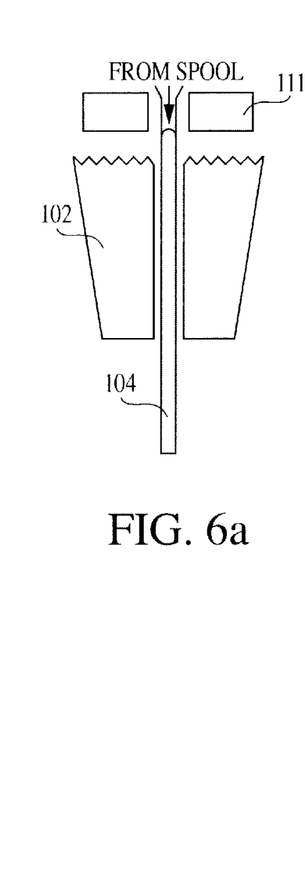
FIGS. 6a–6d illustrate process steps for solder bump formation using solder wire.
Figure 6B:
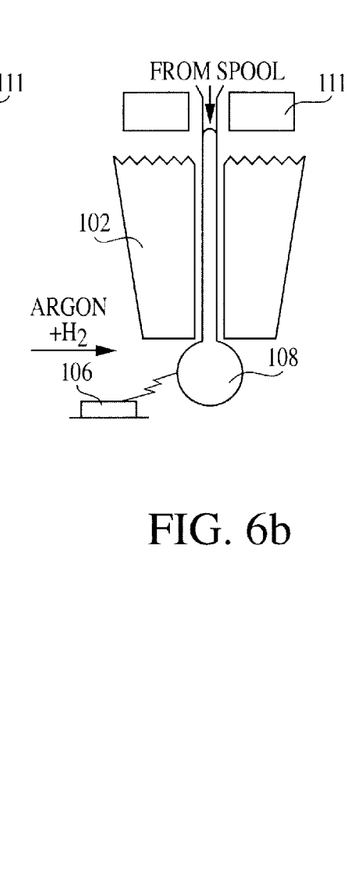
Figure 6C:
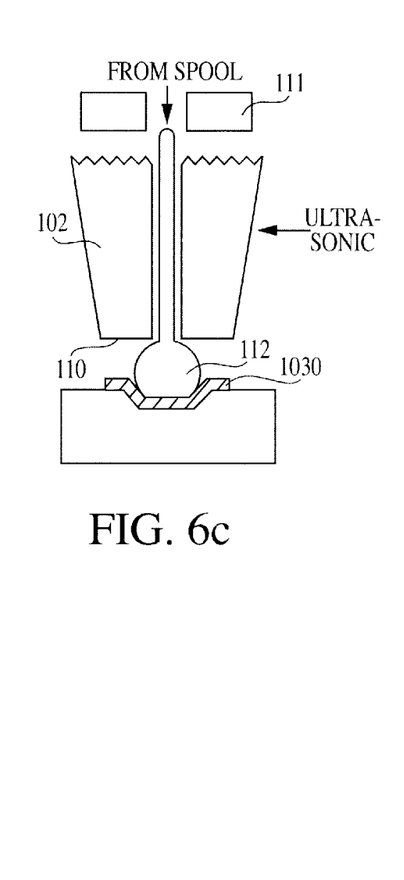
Figure 6D:
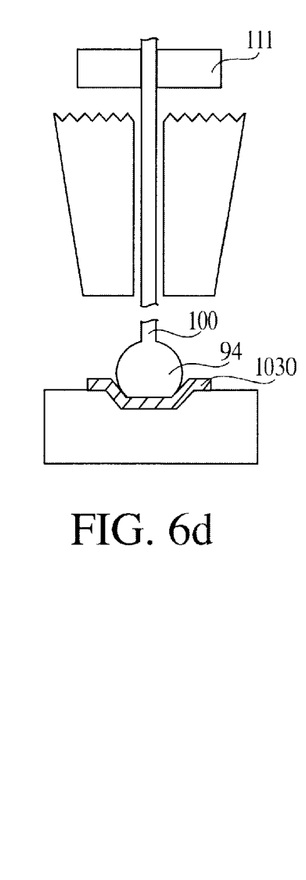

FIGS. 6*a*–6*d* illustrate the various steps in the process of solder bump formation using solder wire. A commercially available wire bonder (which can be in varying compositions of Pb Sn) may be used for this purpose. A solder wire 104 is inserted through a ceramic capillary 102 of suitable diameter as shown in FIG. 6*a*. A solder ball 108 is formed at the bottom of the capillary by an arc discharge between an electrode 106 and the wire in an Argon+Hydrogen gas, as shown in FIG. 6*b*. The ball 108 is then bonded to the UBM structure 1030, formed according to the methods of the present invention described above with respect to FIGS. 3*a*–3*e* and 4*a*–4*c*, by pressing the ball against the UBM structure 1030 with the bottom end 110 of capillary 102 and employing ultrasonic power while heating the UBM structure 1030 as illustrated in FIG. 6*c*. After the ball is bonded, the capillary 102 is raised, while the wire is clamped by a clamp 111 above the capillary and pulled. The wire breaks above the neck of the ball, leaving a solder bump 94 with a tail 100, as shown in FIG. 6*d*. The cycle is repeated with ball formation by arc discharge. The solder bump 94 may then be reflowed to produce a smooth solder bump.

Figure 7A:
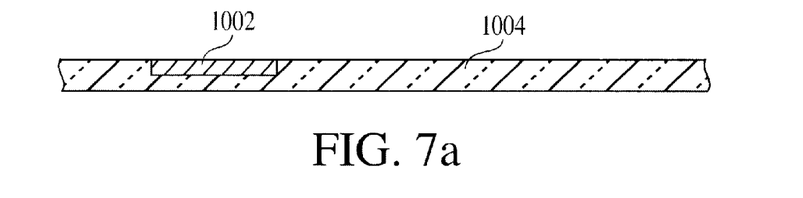
FIGS. 7a–7g illustrate a method for repatterning the active surface of a flip chip.
Figure 7B:
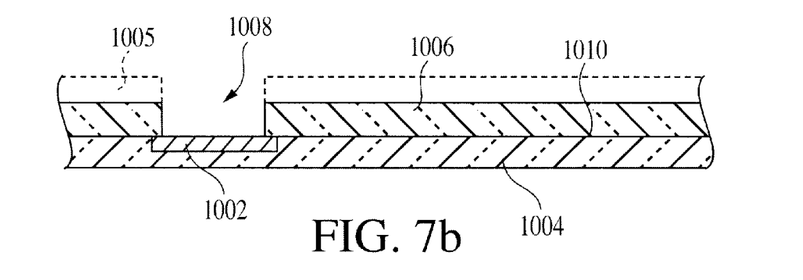

While the invention has been described as having the UBM structure and solder bump 80 formed directly on top of a bond pad 54 in wafer 50, the invention need not be so limited. FIGS. 7*a*–7*g* illustrate a method for repatterning an active surface of a flip chip. The process begins with a substrate or semiconductor wafer 1004 including a bond pad 1002, as shown in FIG. 7*a*, bond pad 1002 being in communication with circuitry such as 51 illustrated previously. A first layer of passivation film 1006 as previously described is applied over a surface 1010 of the semiconductor wafer 1004. A photoresist 1005 is applied, masked and exposed (broken lines in FIG. 7*b*). The passivation film 1006 is then etched to form a bond pad via 1008 through the passivation film 1006 to the bond pad 1002, as shown in FIG. 7*b*.

Figure 7C:
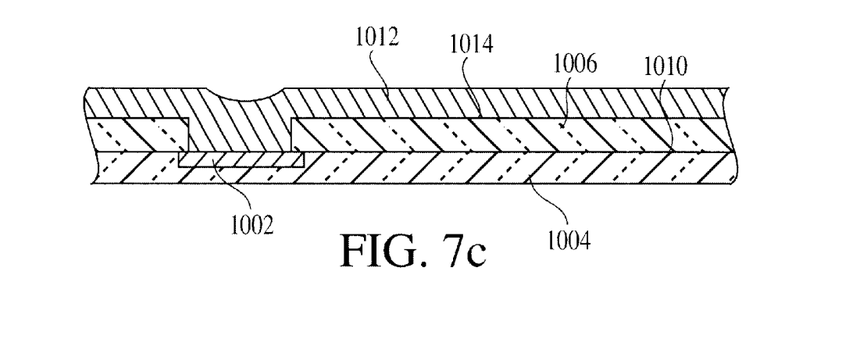
Figure 7D:
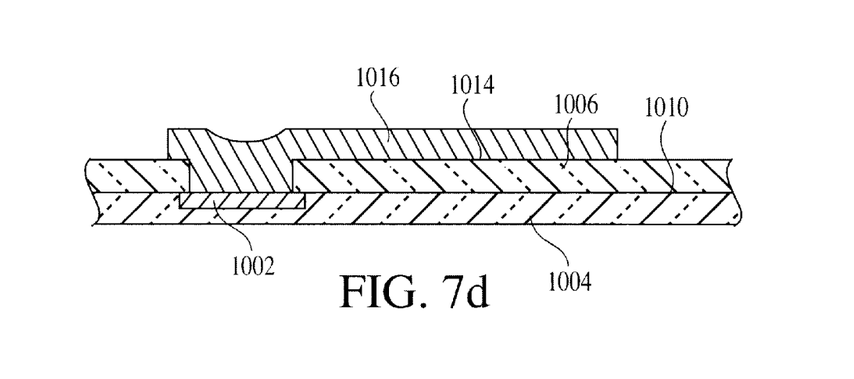
Figure 7E:
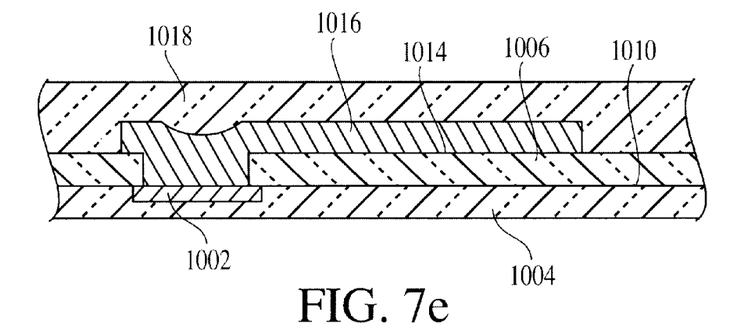
Figure 7F:
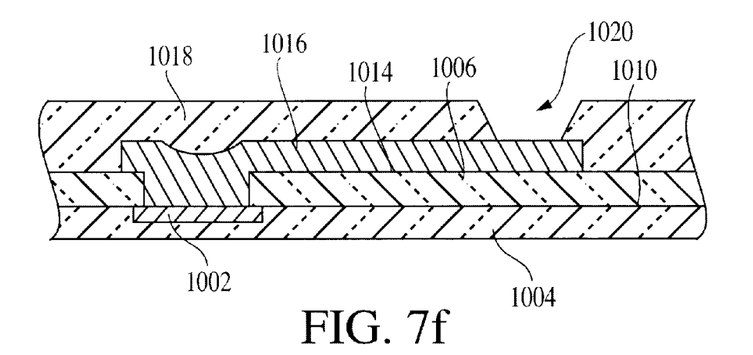
Figure 7G:
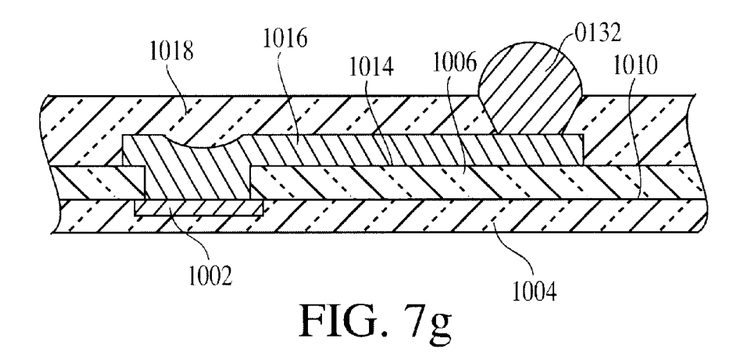

A conductive layer 1012, preferably aluminum or copper is applied over a face surface 1014 of the passivation film 1006, as shown in FIG. 7*c*. The conductive layer 1012 is then photoresist-coated, masked, exposed and etched to form at least one conductive repattern trace 1016 extending to a substitute or alternative bond pad location, as shown in FIG. 7*d*. A second passivation film 1018, such as for example a photoimageable polyimide layer, is applied over the conductive repattern trace 1016, as shown in FIG. 7*e*, which is patterned directly to form a via 1020 which exposes a face surface of the conductive repattern trace 1016 as shown in FIG. 7*f*. A solder ball 0132 is then formed directly in the via 1020, as shown in FIG. 7*g*.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A solder connection for a bond pad of a semiconductor substrate comprising:

a reflowed solder bump formed on said conductive trace, said reflowed solder bump comprising at least a first material and a second material, said second material being provided by a second metal layer initially provided over said conductive trace which flows into said first material during a reflow operation, said bump pad being located in a via provided in a film.

2. The solder connection according to claim 1, wherein said solder bump first material comprises a low alpha emission solder of less than 0.001 hits/cm$^2$/hr.

3. A solder connection for a conductive trace of a semiconductor substrate comprising:

a reflowed solder bump formed on said conductive trace, said reflowed solder bump comprising at least a first material and a second material, said second material being provided by a second metal layer initially provided over said conductive trace which flows into said first material during a reflow operation, wherein said second metal layer is a silver layer between approximately 50 and 1000 Å thick.

4. A solder connection for a conductive trace of a semiconductor substrate comprising:

a reflowed solder bump formed on said conductive trace, said reflowed solder bump comprising at least a first material and a second material, said second material being provided by a second metal layer initially provided over said conductive trace which flows into said first material during a reflow operation, wherein said conductive trace is formed of a composition of nickel and titanium.

5. A solder connection for a conductive trace of a semiconductor substrate comprising:

a reflowed solder bump formed on said conductive trace, said reflow solder bump comprising at least a first material and a second material, said second material being provided by a second metal layer initially provided over said conductive trace which flows into said first material during a reflow operation, wherein said solder bump first material is formed of a low alpha emission solder of less than 0.001 hits/cm$^2$/hr.

6. A solder connection on a copper bond pad of a semiconductor substrate comprising:

a reflowed solder bump formed on said copper bond pad comprising at least a first material and a second material, said second material being a first metal layer initially overlying said copper bond pad which flows into said first material during a reflow operation, wherein said first metal layer is formed of silver.

7. A solder connection on a copper bond pad of a semiconductor substrate comprising:

a reflowed solder bump formed on said copper bond pad comprising at least a first material and a second material, said second material being a first metal layer initially overlying said copper bond pad which flows into said first material during a reflow operation, wherein said solder bump first material is formed of a low alpha emission solder of less than 0.001 hits/cm$^2$/hr.

* * * * *

UNITED STATES PATENT AND TRADEMARK OFFICE
CERTIFICATE OF CORRECTION

PATENT NO. : 6,570,251 B1  Page 1 of 1
DATED : May 27, 2003
INVENTOR(S) : Salman Akram et al.

It is certified that error appears in the above-identified patent and that said Letters Patent is hereby corrected as shown below:

Column 1,
Line 38, "aligned" should be -- align --;

Column 3,
Line 65, "invention; and" should be -- invention; --;
Line 67, "wire." should be -- wire; and --;

Column 7,
Lines 5 and 9, "conductive trace" should be -- bond pad --;
Lines 10 and 11, "said bump pad being located in a via provided in a film" should be -- wherein said second metal layer is silver --.

Signed and Sealed this

Fourteenth Day of October, 2003

JAMES E. ROGAN
*Director of the United States Patent and Trademark Office*